United States Patent [19]

Brett et al.

[11] Patent Number: 4,815,342
[45] Date of Patent: Mar. 28, 1989

[54] METHOD FOR MODELING AND BUILDING DRILL BITS

[75] Inventors: James F. Brett; Lawrence A. Sinor, both of Tulsa; Tommy M. Warren, Coweta, all of Okla.

[73] Assignee: Amoco Corporation, Chicago, Ill.

[21] Appl. No.: 133,684

[22] Filed: Dec. 15, 1987

[51] Int. Cl.$^4$ .............................................. B21K 5/02
[52] U.S. Cl. .................................. 76/108 A; 364/149; 364/474.01
[58] Field of Search ............. 76/108 R, 108 A, 101 R, 76/101 E; 364/474.01, 149

[56] References Cited

U.S. PATENT DOCUMENTS 4,350,215 9/1982 Radtke .............................. 76/108 A Primary Examiner—Roscoe V. Parker
Attorney, Agent, or Firm—Scott H. Brown; Fred E. Hook

[57] ABSTRACT

A method for modeling and building drill bits. An array of spatial coordinates representative of selected surface points on a drill bit body and on cutters mounted thereon is created. The array is used to calculate the position of each cutting surface relative to the longitudinal axis of the bit body. A vertical reference plane which contains the longitudinal axis of the bit body is established. Coordinates defining each cutter surface are rotated about the longitudinal axis of the bit body and projected onto the reference plane thereby defining a projected cutting surface profile. In manufacturing a drill bit, a preselected number of cutters are mounted on the bit body. A model of the geometry of the bit body is generated as above described. Thereafter, the imbalance force which would occur in the bit body under defined drilling parameters is calculated. The imbalance force and model are used to calculate the position of an additional cutter or cutters which when mounted on the bit in the calculated position would reduce the imbalance force. A cutter or cutters is then mounted in the position or positions so calculated.

19 Claims, 10 Drawing Sheets

METHOD FOR MODELING AND BUILDING DRILL BITS

BACKGROUND OF THE INVENTION

1. Field of the Invention

The instant invention relates to methods for modeling and building drill bits and, more particularly, to such a method in which a geometrical model of the bit can be used to calculate drill bit cutter forces for a given set of drilling conditions.

2. Setting of the Invention

Solid body drill bits of the type not having rolling cones usually include a bit body, typically having a tapered lower end and an upper end, which is connectable to a drill string for rotating the bit and applying weight thereto during drilling. These bits include a plurality of cutters each of which includes a substantially planar cutting surface. The cutters are usually mounted on the tapered lower portion of the bit with a few being mounted on the side adjacent the tapered portion.

In order to drill through a subterranean formation material, a penetrating force, which is produced by the weight of the drill string, must be applied to the drill bit in order to embed the cutters into the rock and to keep the cutters embedded during drilling. Once the cutters are embedded, a cutting force must be applied thereto in order to cut rock from the formation. The cutting force is applied by rotating the drill string.

For a given rock strength, the drill bit rotation rate and bit penetration rate require a corresponding penetration force and cutting force on the cutters. In general, as rock strength and rotation and penetration rates increase, the required penetrating and cutting forces increase. The magnitude and direction of penetrating and cutting forces applied to the cutters is also dependent upon the angular orientation of each cutting surface. Since the cutters are usually mounted on a tapered lower surface of the drill bit, both the penetrating and cutting forces acting on the cutters include a radial component relative to the drill bit longitudinal axis. The sum of the radial components of the cutting and penetrating forces are known as the "imbalance force." This imbalance force tends to push the bit into the wall of the hole as the bit rotates. A bit with a large imbalance force drills more slowly and does not last as long as a bit with a relatively small imbalance force. It is thus desirable to design drill bits having minimal imbalance forces.

Past drill bit designers have used equations from which the penetrating and cutting forces can be determined for a given penetration or depth of cut (which is a function of the rotation and penetration rates), rock strength and cutting face positions relative to the longitudinal axis of the drill bit. Bits in the past have been designed to produce an imbalance force (the sum of the radial components of the cutting and penetrating forces) of zero. However, because of the manufacturing process for such bits, the bit as manufactured often in fact have a relatively large imbalance force.

Manufacturing drill bits typically involves brazing a polycrystalline diamond compact (PDC) directly to the drill bit body or to a stud which is press fitted into the body. The brazing and press fitting processes do not permit accurate positioning of the PDC cutting surface and thus the positions of the PDC cutting surfaces as manufactured may vary from the positions as designed thereby introducing a significant imbalance force. The imbalance force causes the bit to have a shorter life and a slower rate of penetration than a bit with a nonexistent or relatively small imbalance force.

It would be desirable to have a method for calculating the cutter forces and imbalance force for a selected drill bit under a given set of drilling conditions prior to actually using the bit. Such a method can be used as a quality control to select bits having the lowest imbalance forces arising therein under given drilling conditions. It would be desirable to utilize a method of manufacturing drill bits which minimizes the imbalance forces arising in the drill bits when drilling.

There exists a need for accurately calculating the cutter forces and imbalance force which will act on a selected drill bit for a given set of drilling conditions.

There exists a need for a method of manufacturing a drill bit which, will minimize the imbalance which arises in the bit during drilling.

DETAILED DESCRIPTION OF THE PREFERRED MODES OF IMPLEMENTING THE METHOD OF THE INVENTION

The instant invention comprises a method for generating a geometric model of the cutting surfaces on a drill bit. The model can be used to calculate the forces acting on each of the cutting surfaces.

In one aspect of the invention, a model is used to build a drill bit. In so doing, a major portion of the cutters are installed on the drill bit, a geometrical model of the bit is generated and the forces acting on each of the cutters for given drilling conditions are calculated. Thereafter, exact positions for the remaining cutters to be installed are calculated with the calculated position minimizing the radial component of the forces acting on the cutters. The remaining cutters are then installed in the calculated position.

Figure 2:
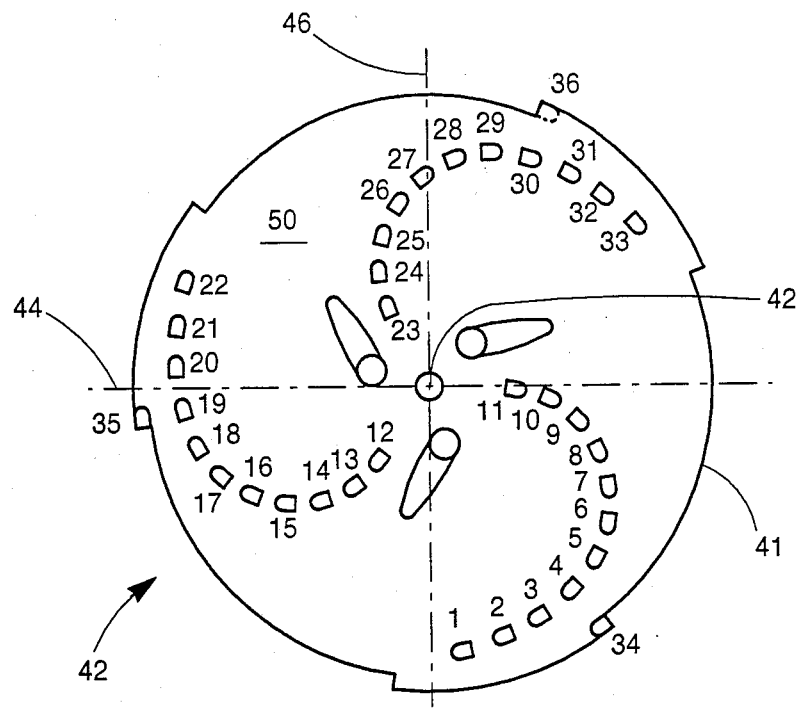
FIG. 2 is a top plan view of the drill bit shown in FIG. 1.
Figure 1:
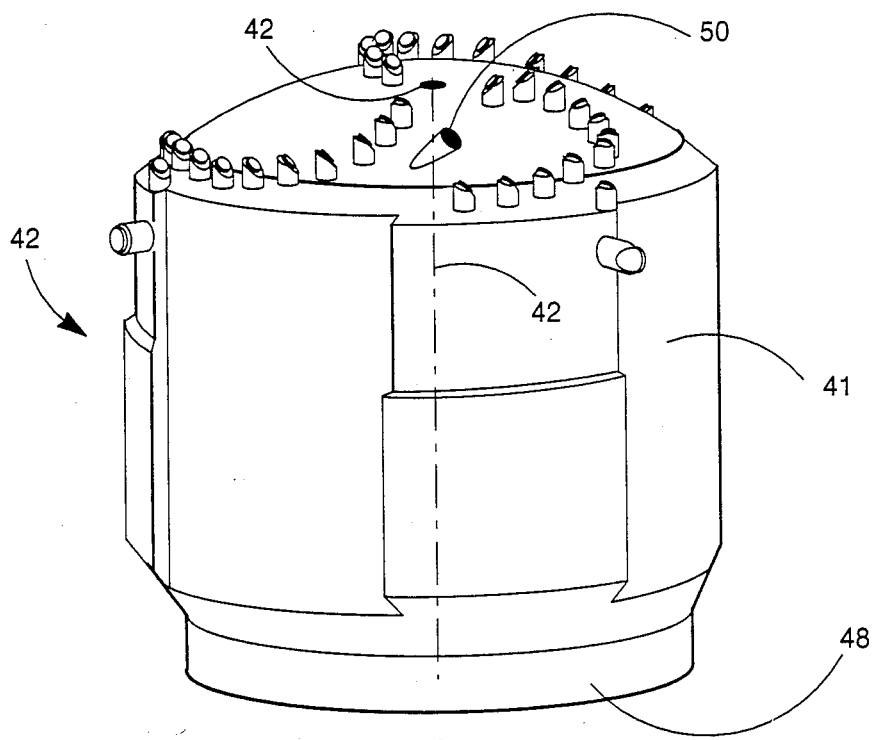
FIG. 1 is a side view of a commercially available drill bit.

Turning now to FIGS. 1 and 2, indicated generally at 40 is a commercially available drill bit. Drill bit 40 includes a substantially cylindrical drill bit body 41 having a plurality of cutters, such being numbered sequentially 1-36, mounted thereon.

The longitudinal axis of the bit body is indicated by a vertical dashed line 42 in FIG. 1 and is also identified as the intersection of dashed-line axes 44 and 46 in FIG. 2. The lower portion of bit body 41 includes a shank 48 by which the bit can be attached to the lower end of a drill string for drilling a wellbore. The upper portion of the bit body includes a rounded surface 50 upon which the cutters are mounted and which is directed toward the bottom of the hole during drilling. It can be seen that the slope of the upper end of the bit body increases between central axis 42 and the outer edges of the bit body. For example, cutters 11, 12, 23 are in a more upright position than are the cutters toward the radially outer edge of upper surface 50, such as cutters 1, 2, 3.

Figure 3:
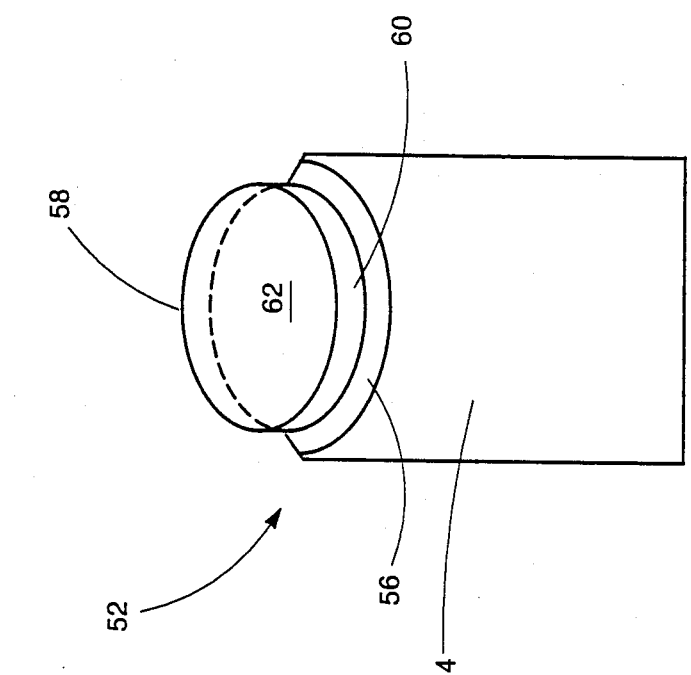
FIG. 3 is a front view of a cutter having a PCD cutting surface formed thereon.
Figure 4:
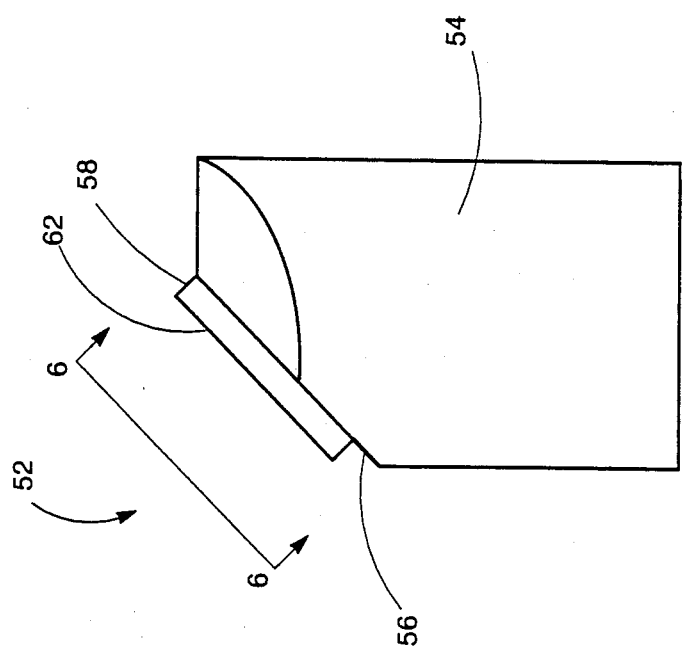
FIG. 4 is a right side view of the cutter of FIG. 3.

Turning now to FIGS. 3 and 4, indicated generally at 52 is a cutter similar to those mounted on drill bit 40. The cutter includes a substantially cylindrical stud 54, for example, formed from tungsten carbide. Stud 54 includes a substantially planar surface 56 formed thereon upon which is mounted a polycrystalline diamond compact (PDC) cutting element 58. PDC cutting element 58 includes a cylindrical carbide substrate 60 having a cutter surface or face 62 formed thereon. Cutting face 62 comprises a thin layer of polycrystalline diamond bonded to substrate 60 and PDC cutting element 58 is mounted on surface 56 by brazing between the lower side of substrate 60 and surface 56.

Each of cutters 1-36 is substantially the same as cutter 52. The cutters are mounted on drill bit body 40 by press fitting the same into bores in upper surface 50 which are disposed over the upper surface in the same pattern as the three spirals formed by the cutters in FIG. 2. Each of the cutters is press fitted into its associated bore in the drill bit body to form the cutter pattern shown in FIG. 2.

Figure 5:
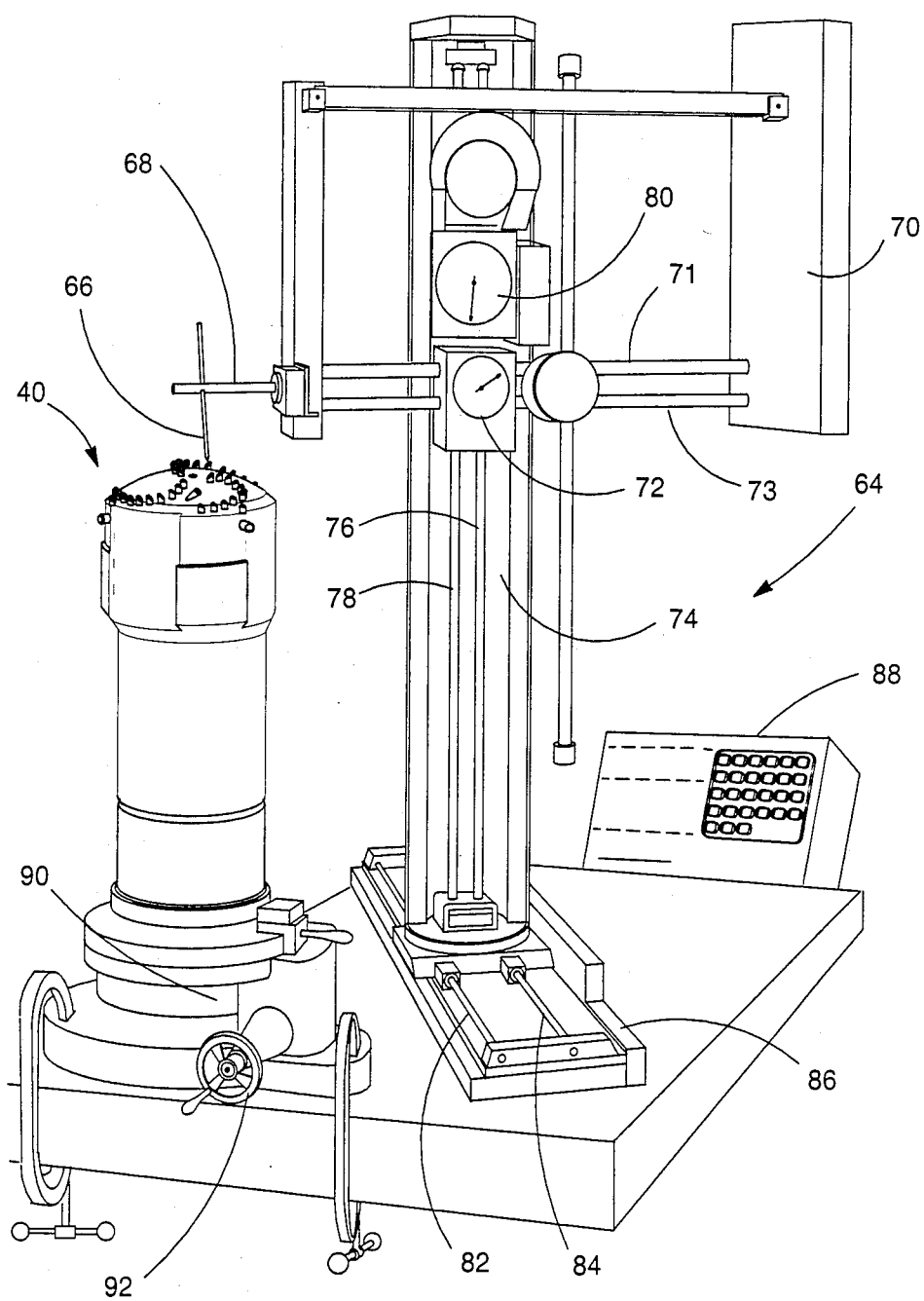
FIG. 5 is a perspective view of a coordinate measuring machine and a drill bit.

Turning now to FIG. 5, indicated generally at 64 is a commercially available coordinate measuring machine shown adjacent bit 40. The coordinate measuring machine includes a pointer 66 fixedly mounted on a slidable arm 68. The lower end of pointer 66 is formed into a point which is fixed relative to arm 68.

Arm 68 is mounted on a laterally slidable frame 70. Frame 70 includes parallel rods 71, 73 along the axis of which frame 70 may slide. A meter 72 indicates the lateral position of frame 70 relative to an upright base 74.

Frame 70 is also vertically moveable along parallel rods 76, 78 with the height of the frame being indicated by a meter 80.

Parallel rods 82, 84 are mounted on a lower fixed base portion 86. Rods 82, 84 support upright base 74 for sliding movement along the axis of rods 82, 84. A meter (not visible) indicates the relative position of base 74 on rods 82, 84. Rods 82, 84 are oriented in space perpendicular to rods 76, 78 ad to rods 71, 73. Likewise, rods 76, 78 and rods 71, 73 are each perpendicular to each of the other two sets of rods.

The readings on the meters indicate the relative positions of the rods used to define a point in space occupied by the pointed end of pointer 66. The position of the point on the pointer can thus be referenced to a three-dimensional coordinate system defined by X, Y and Z axes with each meter representing a relative position along one of the axes. A digital meter 88 provides a read-out of the X, Y and Z coordinates of the point on pointer 66 and also provides such coordinates, upon operator command, to the memory of a commercially available computer (not shown).

Drill bit 40 is mounted on a rotary turntable 90, the angular position of which is controlled by handle 92. An angular scale, not visible, shows the angular position of the turntable and thus of drill bit 40 which is supported thereon with its axis aligned with the turntable axis.

In the instant mode of implementing the method of the invention, pointer 66 is positioned on a plurality of points on the surface of the drill bit and the coordinates of each particular point are stored in the computer. From this data, a computer model of the drill bit is constructed. In making the measurements, a first set of measurements is made around the side of the bit so that the computer has data from which the longitudinal axis, axis 42 in FIGS. 1 and 2, of the bit can be determined. A second set of measurements on the perimeter of each cutter face is made. In making the measurements, the angular position of rotary table 90 is noted and is associated with the three values which are produced by measuring machine 64 for all measurements taken at that particular angle of the rotary table. This enables all measurements to be taken substantially normal to each measurement point and increases the accuracy of the measurement process.

After the bit is rotated 360° and several points are measured about the circumference thereof and recorded, each cutter face on cutters 1-36 is measured.

Figure 6:
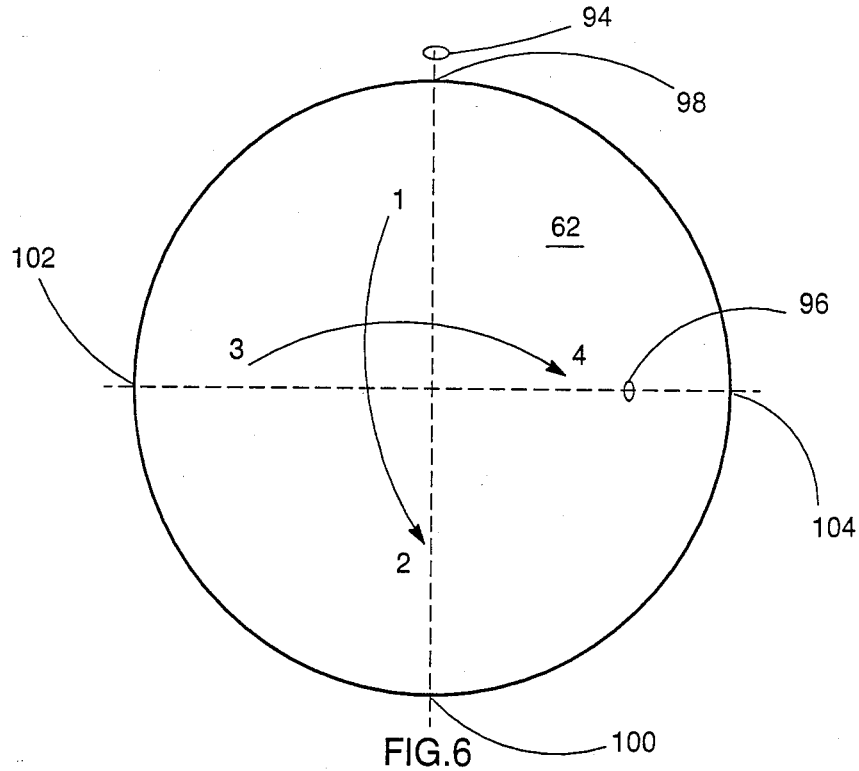
FIG. 6 is a view of an unworn PCD cutting surface taken along line 6—6 in FIG. 4.
Figure 7:
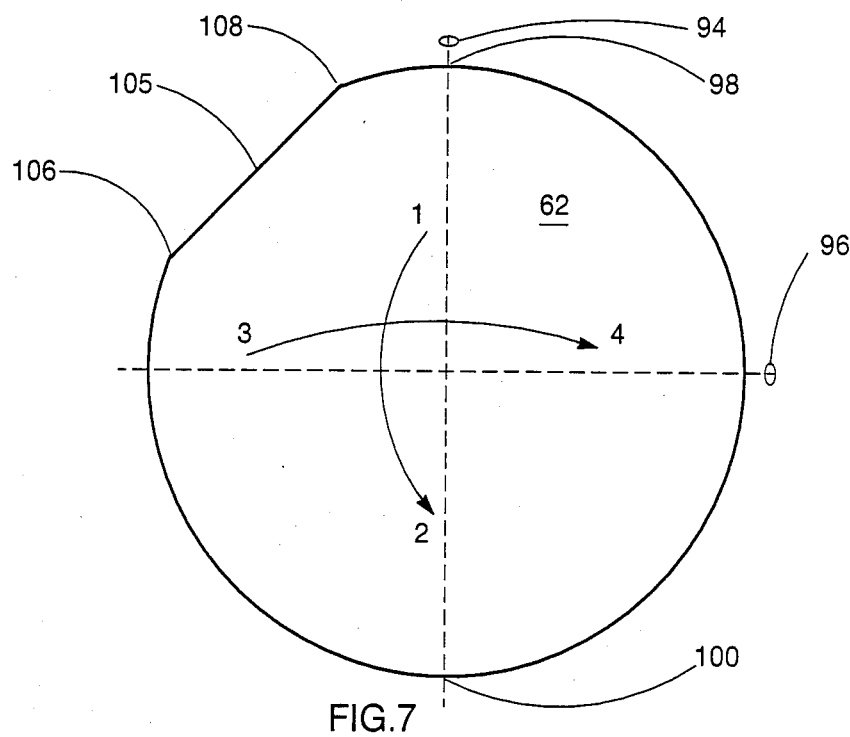
FIG. 7 is a view similar to FIG. 6 showing a worn PCD cutting surface.

For a description of the manner in which these measurements are made attention is directed to FIGS. 6 and 7. Each cutter face includes a vertical axis 94 which is substantially parallel to the cutter face and extends from the uppermost portion thereof to the lowermost portion. Also included is a horizontal axis 96 which extends from the leftmost to the rightmost portions of the cutter face and is parallel thereto. In making the measurements with the coordinate measuring machine, the point on pointer 66 in FIG. 5 is first positioned at the intersection of axis 94 with the perimeter of cutter face 62, such defining a first measurement point 98. A second measurement point 100 is located at the intersection of axis 94 with the lower edge of cutter face 62. A third measurement point 102 is at the left side intersection of axis 96 with the outer perimeter of cutting face 62 while a fourth measurement point 104 is at the right side intersection of axis 96 with the perimeter of cutting surface 62.

The numbers and arrows shown in the central portion of cutting face 62 in FIGS. 6 and 7 indicate the order in which the first four measurements on each cutting face on the drill bit are taken: along the cutting face vertical axis first and thereafter along the cutting face horizontal axis. When the point on pointer 66 is positioned first at point 98, the coordinates and angular position of the turntable are provided to the computer and likewise for each of the other four measuring points.

FIG. 7 is a view of cutting surface 62 after the bit has been used to drill a bore and thus includes a wear flat 105 on one side thereof developed as a result of the cutter being urged against the rock formation during drilling. When such irregularities occur on the perimeter of the cutting surface as in the case of FIG. 7, fifth and sixth measurement points 106 and 108 are taken in order to completely define the perimeter of the cutting face.

As each measurement is put into the computer, it is associated with a number which indicates the order in which the measurement was taken. In FIG. 6, the measurements at points 98, 100, 102 and 104 are numbered 1, 2, 3, 4, respectively, and in FIG. 7, the measurements are similarly numbered with measurements at points 106 and 108 being additionally numbered 5 and 6, respectively. Each cutting face is measured at a single angle on the turntable which is also recorded. In addition to the foregoing, a value is recorded to indicate the general shape of the edge of the cutting face between adjacent measurements. If the shape is generally a straight line, a zero is recorded and if the shape is generally a circular arc, a one is recorded. Thus, a number is provided to the computer memory to indicate the general shapes between each of the adjacent measuring points in FIG. 6.

In FIG. 7, a number value of one is recorded between the first and fourth measurements, between the fourth and second measurements, between the second and third measurements, between the third and fifth measurements, and between the sixth and first measurements while a zero is recorded between the fifth and sixth measurements to indicate the substantially straight line edge formed by worn portion 105. Thus, each of the recorded measurement points defines the perimeter of a cutting surface having a fixed angular orientation relative to the longitudinal axis of the drill bit. In addition, the connectivity between each adjacent point is stored in the computer memory. The connectivity is simply an indication of the shape of the cutting face perimeter between adjacent measurements. As will later become more fully apparent, the connectivity value between adjacent measurements is used to interpolate additional coordinates using circular interpolation, when the connectivity is one, and linear interpolation, when the connectivity is zero.

Figure 8:
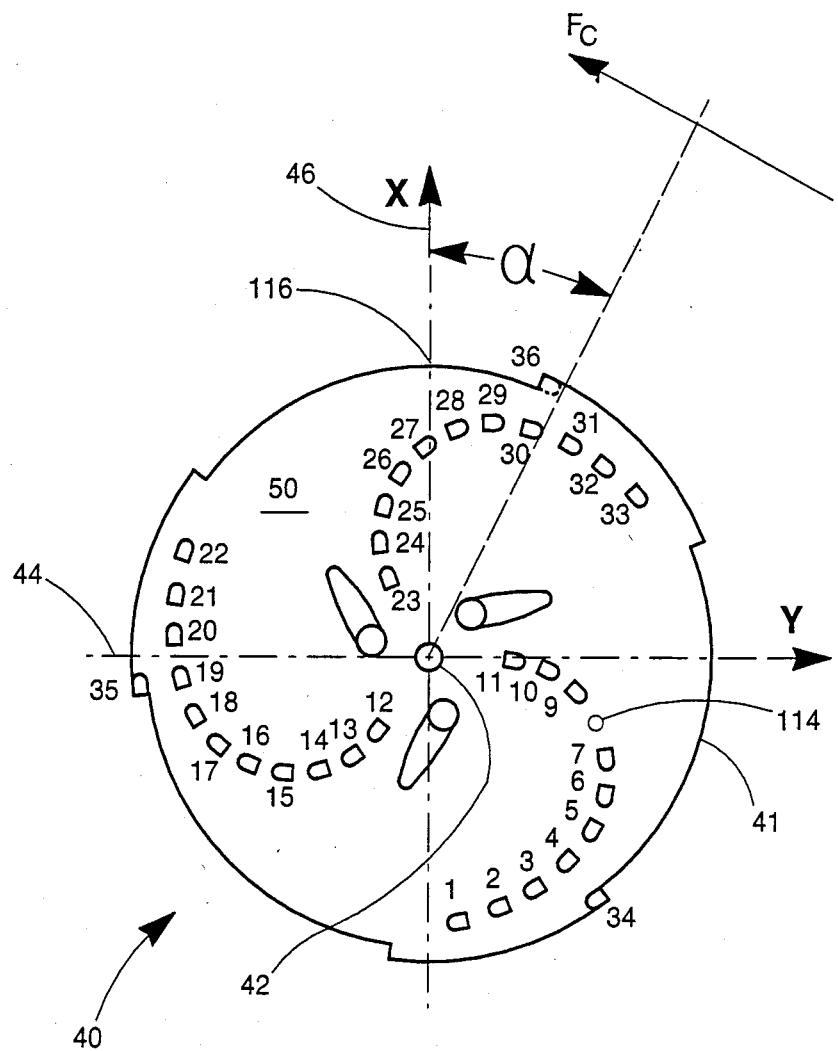
FIG. 8 is a plan view of the drill bit of FIG. 2 with a selected cutter not yet installed.

Turning now to FIG. 8, drill bit 40 is shown partway through the process of manufacture. As can be seen, cutters are all mounted on drill bit body 41, except for cutter 8. A bore 114 is formed in body 41 to receive the stud, like stud 54 in the cutter of FIGS. 3 and 4, of cutter 8. Each of the other cutters has its stud press fitted into an associated bore in the drill bit body. Prior to mounting cutter 8 on the drill bit body, the dimensions of the drill bit body around the circumference thereof and the cutting faces of each of the cutters which are installed on the drill bit body are recorded and entered into a computer memory as previously described. Thus, the computer has data relating to the circumference of the drill bit body (from which the bit axis designated by axis 42, can be determined) and the position of each cutter face (except, of course for cutter 8 which is not yet installed) in space relative to the bit axis.

Figure 9:
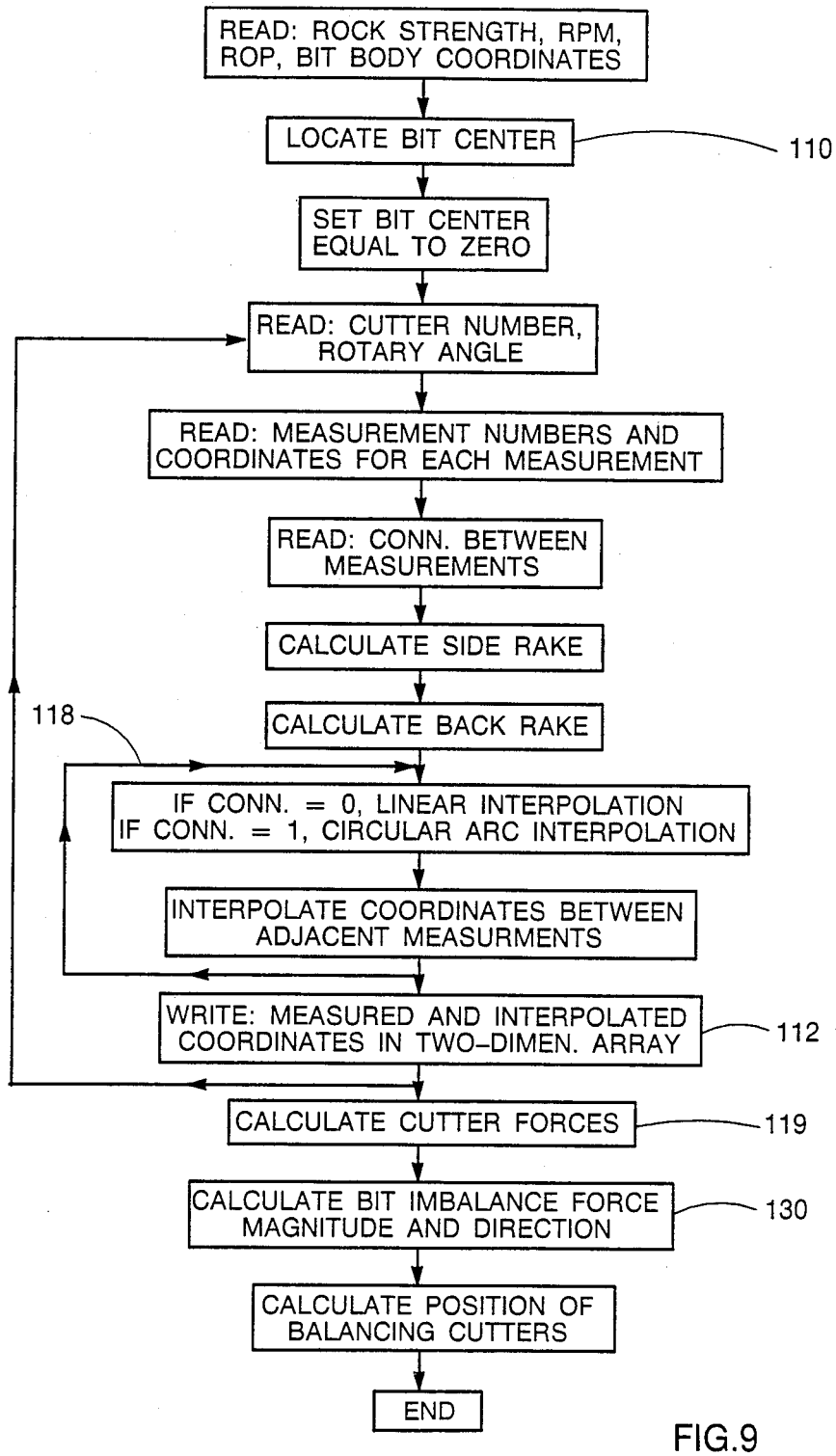
FIG. 9 is a flow chart illustrating the preferred mode of implementing the method of the instant invention.

Turning now to FIG. 9, included therein is a flow chart of a computer program for use in connection with manufacturing a drill bit. Although the entire flow chart deals with the manufacture of the drill bit, a significant portion of the computer program relates only to generating a model of a drill bit. As will later become more fully apparent, that portion of the program relating to modeling the bit begins at box 110 with the step of "Locate Bit Center" and concludes with box 112, "Write: Measured and Interpolated Coordinates in Two-Dimensional Array."

To initiate the program, data is provided relating to the strength of the rock in which the bit is to be used, the rate of revolution of the bit and the rate of penetration, i.e., the rate at which the hole is bored. Also, the bit body coordinates (those taken about the circumference of the drill bit body) are read from the computer memory.

Thereafter, the bit body coordinates are used to locate axis 42 by means of a least squares regression. A subroutine to accomplish this task can be written by a person having ordinary skill in the art.

As will be recalled, each of the three coordinates for each point measured on the bit body are referenced to the coordinate measuring machine rather than to the longitudinal axis of the drill bit body. After the longitudinal axis of the drill bit body is located in the coordinate system in which the measurements were taken, the coordinate system can be translated to set the vertical or Z axis to align with the bit center. Next, the data file for a particular cutter number and the rotary angle at which that data was generated is read from the computer memory. Thereafter, each measurement number, for example, one of a series of sequential numbers identifying the order in which the measurements were taken, is read with the coordinates associated with that particular measurement number. Then, the connectivity between adjacent measurements is read which, as will be recalled, defines the general shape, either straight line or generally circular arc, between adjacent measurements.

Next, the side rake of each cutter face is calculated. The side rake is defined relative to a vertical reference plane which contains axes 44, 46 as shown in FIGS. 1 and 2. The plane passes through the center of the drill bit body and divides it into equal halves. Coordinates which define the horizontal cutting face axis for a particular cutter, such being measurement points 102, 104 in FIG. 6, are rotated about the circumference of the drill bit center along the path the coordinates would travel during actual drill bit rotation. When the center point of the cutter face intersects the vertical reference plane, the angle between axis 96, the horizontal axis, and the vertical reference plane defines the side rake. It can be seen that the coordinates located at the center point of each cutter surface can be easily calculated since the same is defined by the intersection of axes 94, 96, the position of which are known.

In a similar fashion, back rake is defined as the angle between reference plane 116 and vertical axis 94 after the coordinates defining the horizontal and vertical axes are rotated until the intersection thereof intersects the reference plane. In other words, to calculate both side rake and back rake, the coordinates defining the cutter face are first rotated until the intersection of axes 94, 96 is received in the vertical reference plane. Thereafter, the angles between horizontal axis 96 and the reference plane (side rake) and vertical axis 94 and the reference plane (back rake) are measured. It is to be appreciated that a subroutine capable of rotating the coordinates and measuring angles as above described could be easily written by a person having ordinary skill in the art.

Figure 10:
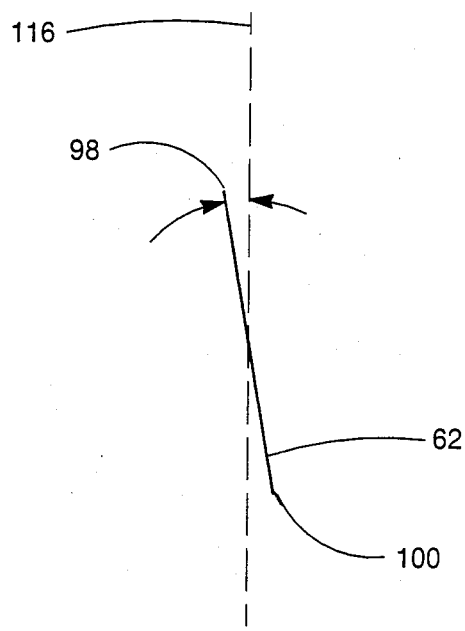
FIG. 10 is a schematic diagram of a PCD cutting surface showing the side rake angle.

By way of example, FIG. 10 is a top view of the drill bit body, similar to FIG. 2, showing a vertical reference plane 116 which contains axes 42, 46. A cutter surface 62, representative of one of the cutter surfaces on drill bit 40, has been rotated until the center thereof intersects plane 116 as shown. It can be seen that since surface 62 is parallel to the longitudinal axis 42 of the drill bit body, there is zero degrees back rake. Thus, the angle shown in FIG. 10 is the side rake.

Figure 11:
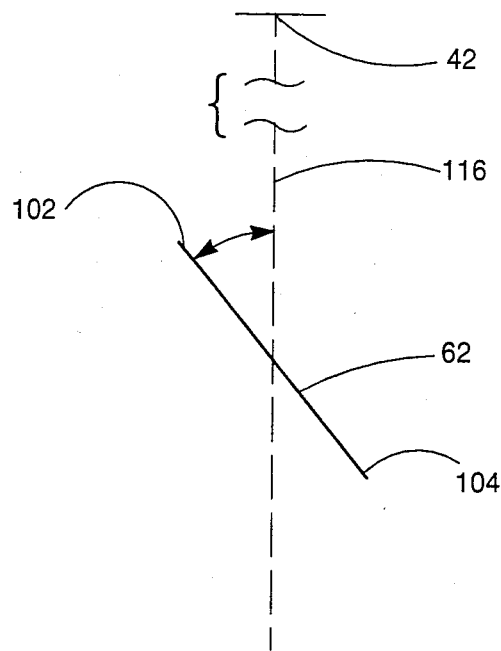
FIG. 11 is a schematic diagram of a PCD cutting surface showing the back rake angle.

FIG. 11 is a view of a cutter surface from the perspective shown in FIG. 1, i.e., from the side of the drill bit. Cutter surface 62 has been rotated until the center of the same intersects plane 116. Surface 62 in FIG. 11 has zero degrees side rake since the surface is parallel with axis 42.

It is to be appreciated that in most cases, cutter surfaces include both slight amounts of back rake and side rake. The views of FIGS. 10 and 11 are for the purposes of illustrating the manner in which back rake and side rake is measured.

Turning again to the flow chart of FIG. 9, after calculation of side and back rakes for a particular cutter surface, the program selects a measurement point on the circumference of the cutter surface and checks the connectivity between that point and the next clockwise measurement point. If the connectivity is zero, a linear interpolation is run between the adjacent coordinates to establish a series of coordinates along a straight line between the adjacent measured points. The program continues to the next clockwise measuring point, checks the connectivity between the adjacent points and if equal to 1, generates a series of coordinates by circular arc interpolation between the adjacent points. The program continues in a clockwise fashion about the cutter surface until a plurality of coordinates are produced by interpolation between adjacent measuring points which define the perimeter of the cutter surface. A loop 118 continues until coordinates have been interpolated between all measuring points thus defining the cutter face perimeter. Next, the program projects both the measured and interpolated coordinates into reference plane 116. Thus, each coordinate in the projected cutter face profile can be designated by two numerals and the measured and interpolated coordinates which define the perimeter of the cutter face are stored in a two-dimensional array. By way of example, attention is directed to FIG. 12 which is a plot of each of the cutter faces on drill bit 40 in FIG. 8 projected into reference plane 116. With the vertical axis corresponding to the drill bit body axis 42, each coordinate in the perimeter of a cutter face profile can be designated by a distance along a radial axis and a distance above the radial axis. For example, on the horizontal axis, zero is at the center of the bit body and 4.25 inches is at the circumference of the bit body since drill bit 40 in this example is an 8.5 inch bit.

Figure 12:
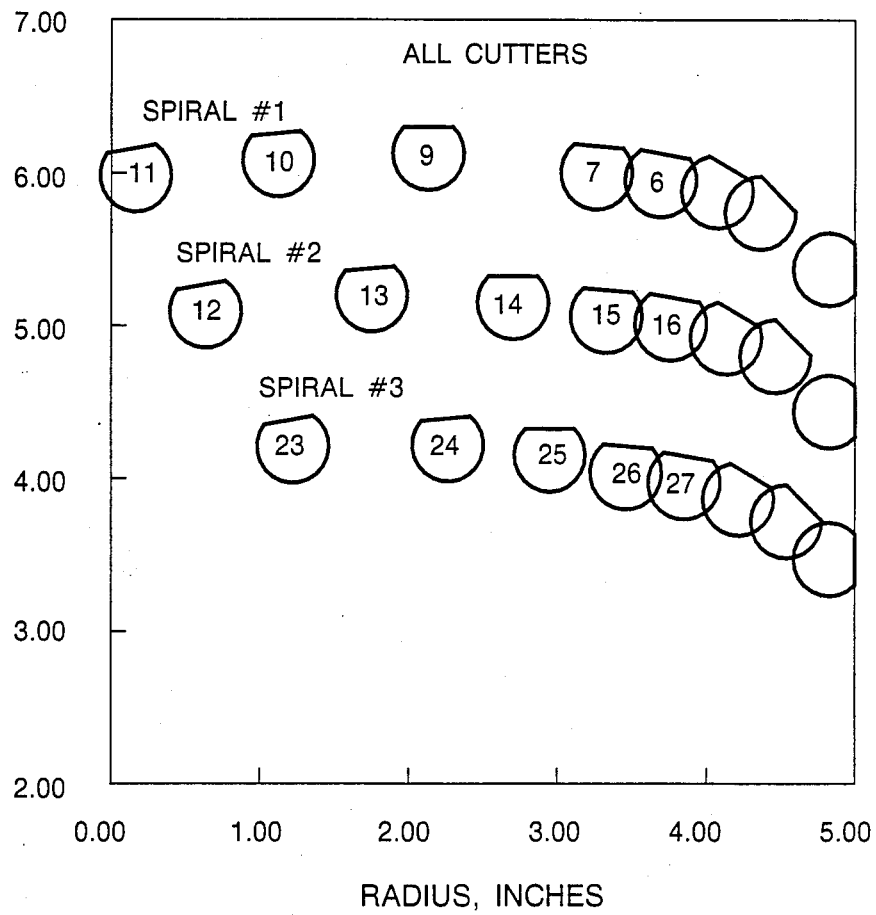
FIG. 12 is a plot of the drill bit cutter surfaces of the drill bit of FIGS. 1 and 2.

The profile in FIG. 12 includes an upper profile, designated "all cutters" which is how each of the cutter surfaces appears projected onto the reference plane. In order to more clearly identify the cutter surfaces in each of the three spirals, a projection onto the reference plane for each spiral is shown beneath the projection for all cutters. It can be seen in spiral number 1 that there is no profile for cutter 8 since the same has not yet been installed.

Figure 14:
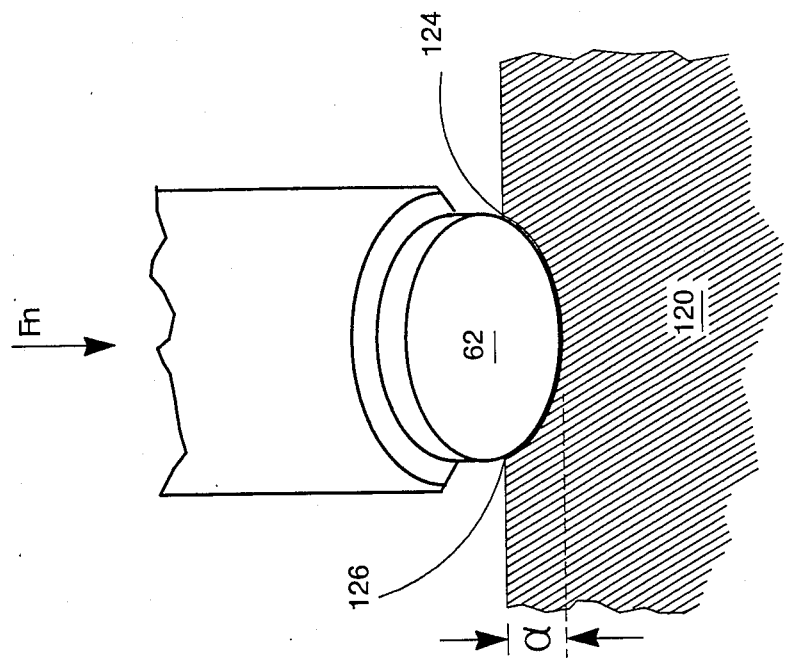
FIG. 14 is a view of a PCD cutting surface taken along lines 14—14 in FIG. 13.

Returning attention again to the Flow Chart of FIG. 9, after each of the cutter faces in cutters 1–7 and 9–36 have been represented in a two-dimensional array as described above, the program proceeds to box 119 and the step of calculating the forces acting on each cutter is undertaken. Considering now FIGS. 13 and 14, generally speaking the forces acting on an individual one of the cutters on the drill bit can be defined as a normal or penetrating force, such being designated $F_n$ in FIGS. 13 and 14, and a cutting force such being $F_c$ in FIG. 13. The normal force is the force required to cause the cutter to penetrate into the rock and is given by the formula:

$$F_n = \frac{\cos(\alpha - EBR)}{1 - \sin(\alpha - EBR)} \cdot d_w \cdot B_f \cdot RS \cdot d_{ce} \cdot C_1 + A_w \cdot RS \cdot C_2$$

In the above formula, alpha is the angle of the cutter from the X axis, in FIG. 8, which serves as an arbitrary reference axis which is parallel to axis 46 and, like axis 46, is contained in plane 116. EBR is the effective back rake which is a function of the real back rake and real side rake, both of which were discussed previously, and the angle at which $F_n$ acts.

Figure 15:
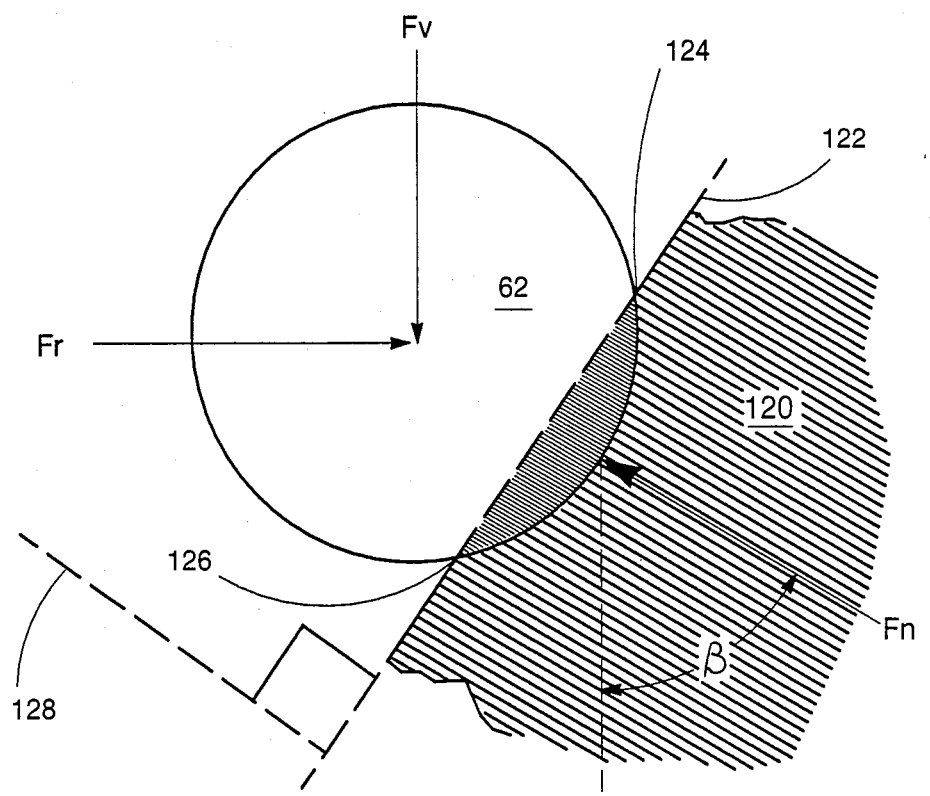
FIG. 15 is a diagram of a drill bit cutting surface embedded in a rock formation.

Referring to FIG. 15, cutting surface 62 is schematically illustrated embedded in a rock formation 120. Although not shown in FIG. 15, most of the other cutting surfaces on the drill bit body are embedded to one extent or another in formation 120. The effective back rake (EBR) may be thought of as the angle between cutting face 62 of the cutter and a cutting plane 122. Cutting plane 122 is parallel to an axis formed between points 124 and 126 on the cutting face and is perpendicular to $F_n$. Points 124 and 126 are the points at which the surface of formation 120 intersects cutting face 62. In other words, the shaded area on face 62 defines the cross-section of the cut in formation 120 being made by cutting face 62.

Plane 122 is further oriented in that a perpendicular axis 128 to plane 122 passes through the longitudinal axis of the bore being drilled. Of course, when there is no wobble of the drill bit during drilling, the longitudinal axis of the bore and the drill bit are coincident.

In summary, the effective back rake is the angle between cutting face 62 and cutting plane 122 as shown in FIG. 15. The effective back rake can be computed when the real side and back rakes are known, which will be recalled, were calculated by the program and when the position of cutting plane 122 is known. The position of cutting plane 122 is dependent upon the depth of the cut which, in turn, is dependent upon the rate of penetration and bit revolution. As will be recalled, these values are input to the program as preselected parameters indicative of the drilling conditions under which the bit will be used.

$B_f$ is the bit factor, a variable which ranges between about 0.75 and about 1.22 and which in the instant mode of implementing the invention is selected to account for slight differences between simulations on the computer model of bit wear for a given drill bit and real drill bit wear occurring under actual conditions. The bit factor, $B_f$, accounts for unexplained effects for a particular bit. A value of this factor greater than 1.0 indicates that the bit drills slower than expected and a value less than 1.0 indicates that the bit drills faster than expected. A person having ordinary skill in the art can empirically determine the value of $B_f$ for a selected drill bit.

The width of cut made by the cutter is designated $d_w$. In the instant mode of implementing the invention, the computer model generates a grid of parallel vertical lines across each cutter face and $d_w$ is equal to the width between adjacent lines. The equation is then calculated for each grid to generate a total force for the cutter.

The effective depth of cut is designated $d_{ce}$ and $C_1$ is a dimensionless constant, which in the instant manner of implementing the invention is equal to 1,100. The manner in which $C_1$ is determined will be shortly described, and $d_{ce}$ can vary slightly from the actual depth of cut.

The manner of selecting the value of $d_{ce}$ is known to persons having ordinary skill in the art.

Considering now the second term of the equation for F, $A_w$ is the wear flat area, RS is again a constant related to the strength of the rock formation and $C_2$ is a constant equal to 2,150.

The first component in the equation for $F_n$ is equal to the amount of downward force required to prevent the cutter face from riding up out of the cut for a selected cutting depth and width. The second component of the equation for $F_n$ includes a factor for a dull cutter which has a wear flat of area $A_w$ formed thereon. This portion of the normal force is that required to compress the rock beneath a dull cutter to enable a sharp cutter to penetrate the rock. $C_1$ and $C_2$ can be empirically determined by first using a new bit thus setting $A_w$ to zero and therefore causing the entire second term to go to zero. A known normal force can be applied and with each of the other factors known, $C_1$ can be determined. Thereafter, the value of $C_1$, 1,100 in the instant mode of implementing the invention, is inserted into the equation and the bit is used until wear flats appear. Thereafter, wear flat area is measured and inserted into the equation which is then solved for $C_2$, which in the instant mode of implementing the invention equals 2150.

Figure 13:
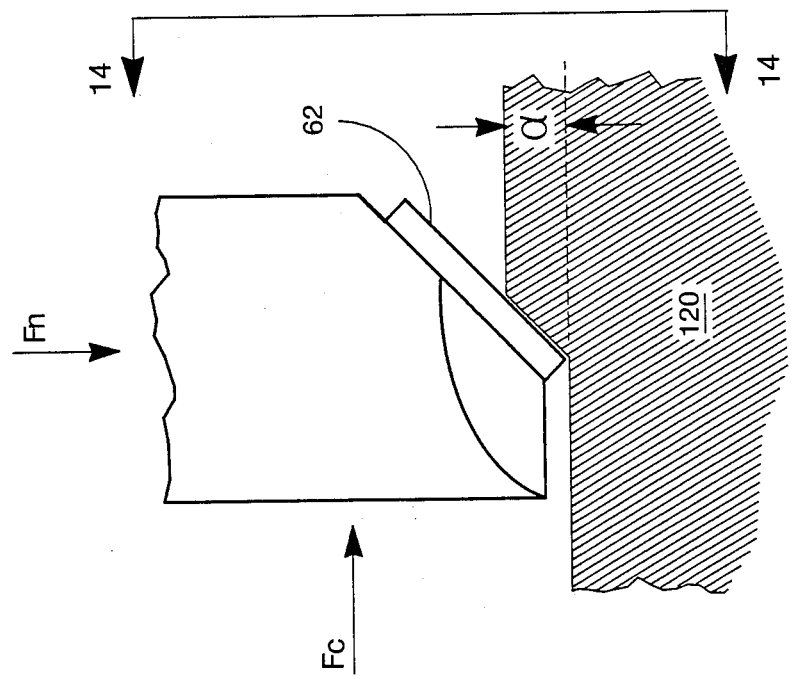
FIG. 13 is a side view of a cutter similar to the cutter of FIGS. 3 and 4, embedded in a rock formation.

The circumferential cutter force, $F_c$ in FIG. 13, is that required to advance the cutter along the cut after the normal force embeds the same in the formation. An arrow depicting the orientation of $F_c$ is also shown in FIG. 8. The circumferential cutter force is dependent upon the sliding friction between the cutter and rock and the force required to fracture the rock. The following equation can be used to calculate the circumferential cutter force:

$$F_c = \frac{\operatorname{Sin}(\alpha - BR)}{1 - \operatorname{Sin}(\alpha - BR)} \cdot C_3 \cdot RS \cdot d_w \cdot d_{cm} + C_4 \cdot F_N$$

The first term of the circumferential cutter force equation is the cutting force, i.e., that required to fracture the rock, and the second term is the nonproductive friction carried on a cutter wear flat. The variables in the equation are as described above and, in addition, $d_{cm}$ is the mean depth of cut. In the instant mode of implementing the invention, the dimensionless constant $C_3$ and $C_4$ are equal to 3,000 and 0.03, respectively.

$C_3$ and $C_4$ can be determined empirically by drilling with two known circumferential forces applied to the drill bit, inserting all the known variables into the circumferential cutting force equation at each value of circumferential force and solving both equations for $C_3$ and $C_4$.

In the example under consideration, i.e., drill bit 40 in FIG. 8, the value of the circumferential and normal forces, as illustrated in FIG. 13, at each cutter is calculated. As noted above, the depth of cut is a function of the rate of penetration and the bit rotation rate which are both provided to the computer as preselected values. Since the cutters on the drill bit can cut on a surface that is inclined to the vertical by an angle beta, illustrated in FIG. 15, the normal force can be resolved into a vertical and radial component and the circumferential force can be resolved into radial components, and a moment about the bit center. The radial component of the normal force, identified as $F_r$ FIG. 15, is equal to $F_n \cdot \sin(\beta)$.

The components of the normal force and the circumferential force which act on the bit in the plane normal to the bit rotational axis can be resolved into a single force acting on the bit center and a single couple, both lying in the normal plane. The couple is the torque required to rotate the bit and the force is the imbalance force, i.e., that force which tends to push the bit against the side of the bore.

It is helpful in computing the magnitude and direction of the imbalance force to resolve the cutter forces into components along the X and Y directions as referenced in FIG. 8. As mentioned, these axes are arbitrarily chosen but are fixed relative to any particular identifying feature on the bit. The vertical penetrating force, $F_v$ has no component in these directions. The radial penetrating force ($F_r$) of the normal force ($F_n$) can be resolved into components along the X and Y axes by the following equations:

$$F_{x-r} = F_r * \cos(\text{alpha})$$

$$F_{y-r} = F_r * \sin(\text{alpha})$$

Since the circumferential force acts at right angles to the radial force for each cutter, it can be resolved into components in the X and Y directions with the following equations:

$$F_{x-c} = F_c * \cos(\text{alpha} - 90)$$

$$F_{y-c} = F_c * \operatorname{sig}(\text{alpha} - 90)$$

It is to be appreciated that at each cutter, there is no radial component of $F_c$; however, when the value of $F_c$ at each cutter is resolved into components along the X and Y axes in FIG. 8 with those vectors being summed, there can be a total radial component of the circumferential force. The total X and Y components of the imbalance force is then obtained by summing the components from the individual cutters as follows:

$$F_{xt} = F_{x-r} + F_{x-c}$$

$$F_{yt} = F_{x-r} + F_{y-c}$$

After such summing, the magnitude of the imbalance force is given by:

$$F_i = \sqrt{F_{xt}^2 + F_{yt}^2}$$

Returning again to the flow chart of FIG. 9, it can be seen that the step identified in box 130 is performed by resolving the cutter forces in a plane perpendicular to the drill bit axis into a single imbalance force as described above.

The final step in the flow chart is identified as "Calculate Position of Balancing Cutters." In the example under consideration, there is only one cutter, cutter 8, remaining to be mounted on the drill bit body. An iterative process can be used to calculate the position for cutter 8 which reduces the imbalance force to zero. First, it can be seen that the cutter can be radially positioned about the longitudinal axis of the cutter stud within bore 114, and further can be installed at depths which vary from completely seated, i.e., with the stud being received abutted against the lower end of bore 114, to some position thereabove. Initially, an arbitrary back and side rake and vertical position of the cutting face, within preselected ranges, is assigned to cutter 8 and the program to model the drill bit and calculate cutting forces is rerun with cutter 8 in the assigned position. The program is repeatedly rerun with the face of cutter 8 being repositioned in a direction which tends to minimize and ultimately eliminate the imbalance force. The program ultimately produces a set of coordinates which identify a position for the cutting face of cutter 8 that eliminates or at least minimizes the imbalance force. Thereafter, cutter 8 is installed with care being taken to position the cutting face thereof in the calculated position.

The following Table I provides an output generated after placement of cutter 8. Calculated values include the volume of cut (volume removed in one revolution) and velocity of each cutter. The given rotary speed and penetration rate are shown below the table. Wear flat area is calculated in a known manner for 5.0 hours drilling. Percent imbalance is the imbalance force expressed as a percentage of weight-on-bit, which is the total of $F_{yt}$ for each cutter.

run to determine the imbalance force. An iterative process similar to that described above can be used to position two or more remaining cutters either within predrilled bores, as in the example under consideration, or the program can be used to determine the position of bores to be drilled.

Moreover, the program is not necessarily limited to cutters of the type having studs extending therefrom which are received in bores in a drill bit body. The same program can be used to position cutters which are directly affixed to a drill bit body.

It can be seen that program permits manufacture of the drill bit with the initial set of cutters being installed with relatively gross manufacturing tolerances as to the position of the cutting faces. Thereafter, when the position of the balancing cutter or cutters is determined which eliminates the imbalance force, great care can be taken to so position the final cutters in order to obtain the result of minimized or eliminated imbalance force. Thus, the method of the invention enables installation of the great majority of cutters under relatively gross tol-

TABLE I

| CUTTER NO | AREA CUT | VOL CUT | β | $F_{xt}$ | $F_{yt}$ | $F_n$ | VEL M/S | WEAR FLAT | EFF BR |
|---|---|---|---|---|---|---|---|---|---|
| 27 | 0.0057 | 0.1081 | 13.4 | 335. | 442. | 455. | 0.96 | 0.02150 | −25. |
| 28 | 0.0054 | 0.1155 | 21.3 | 332. | 431. | 463. | 1.07 | 0.02309 | −25.7 |
| 36 | 0.0000 | 0.0000 | 0.0 | 0. | 0. | 0. | 0.00 | 0.00000 | 0.0 |
| 29 | 0.0063 | 0.1479 | 26.8 | 353. | 458. | 513. | 1.18 | 0.02749 | −24.2 |
| 30 | 0.0091 | 0.2301 | 36.2 | 419. | 531. | 657. | 1.27 | 0.03725 | −20.5 |
| 31 | 0.0042 | 0.1125 | 30.0 | 231. | 328. | 379. | 1.36 | 0.02301 | −22.4 |
| 10 | 0.0165 | 0.0988 | −9.1 | 757. | 893. | 905. | 0.30 | 0.01811 | −23.2 |
| 32 | 0.0011 | 0.0310 | 52.6 | 77. | 80. | 132. | 1.36 | 0.01358 | −24.6 |
| 9 | 0.0137 | 0.1503 | 0.6 | 723. | 867. | 867. | 0.56 | 0.02581 | −25.1 |
| 33 | 0.0000 | 0.0000 | 0.0 | 0. | 0. | 0. | 0.00 | 0.00000 | 0.0 |
| 8 | 0.0110 | 0.1611 | −3.7 | 591. | 735. | 736. | 0.75 | 0.02738 | −25.3 |
| 7 | 0.0078 | 0.1362 | 1.9 | 445. | 578. | 579. | 0.89 | 0.02538 | −25.9 |
| 12 | 0.0086 | 0.0218 | −17.1 | 411. | 458. | 480. | 0.13 | 0.00800 | −23.2 |
| 6 | 0.0053 | 0.1059 | 15.9 | 344. | 452. | 470. | 1.02 | 0.02340 | −26.6 |
| 34 | 0.0000 | 0.0000 | 0.0 | 0. | 0. | 0. | 0.00 | 0.00000 | 0.0 |
| 5 | 0.0071 | 0.1587 | 18.4 | 419. | 547. | 576. | 1.13 | 0.02981 | −25.6 |
| 4 | 0.0051 | 0.1237 | 32.2 | 290. | 361. | 427. | 1.22 | 0.02385 | −23.5 |
| 13 | 0.0115 | 0.0895 | 0.5 | 631. | 714. | 714. | 0.39 | 0.01655 | −25.9 |
| 3 | 0.0046 | 0.1243 | 35.6 | 263. | 352. | 433. | 1.36 | 0.02714 | −23.7 |
| 2 | 0.0003 | 0.0076 | 7.6 | 18. | 40. | 40. | 1.34 | 0.00826 | −17.2 |
| 14 | 0.0077 | 0.0941 | 3.1 | 422. | 542. | 543. | 0.62 | 0.01951 | −24.8 |
| 1 | 0.0008 | 0.0204 | 18.8 | 49. | 99. | 104. | 1.35 | 0.01509 | −18.1 |
| 15 | 0.0070 | 0.1099 | 6.0 | 381. | 508. | 510. | 0.80 | 0.02110 | −24.5 |
| 16 | 0.0065 | 0.1207 | 8.7 | 376. | 512. | 517. | 0.93 | 0.02399 | −25.2 |
| 17 | 0.0067 | 0.1370 | 19.0 | 399. | 519. | 549. | 1.05 | 0.02634 | −25.6 |
| 18 | 0.0030 | 0.0674 | 24.6 | 194. | 276. | 303. | 1.15 | 0.01911 | −25.3 |
| 19 | 0.0024 | 0.0602 | 33.5 | 161. | 207. | 248. | 1.26 | 0.01448 | −26.0 |
| 23 | 0.0151 | 0.0605 | −10.5 | 678. | 800. | 814. | 0.21 | 0.01447 | −22.9 |
| 35 | 0.0000 | 0.0000 | 0.0 | 0. | 0. | 0. | 0.00 | 0.00000 | 0.0 |
| 20 | 0.0015 | 0.0395 | 13.7 | 78. | 140. | 144. | 1.34 | 0.01249 | −18.4 |
| 21 | 0.0009 | 0.0230 | 37.3 | 77. | 98. | 123. | 1.36 | 0.01148 | −29.7 |
| 22 | 0.0004 | 0.0099 | 32.2 | 29. | 47. | 56. | 1.36 | 0.00970 | −24.2 |
| 24 | 0.0124 | 0.1144 | 0.7 | 614. | 744. | 744. | 0.47 | 0.02027 | −24.2 |
| 25 | 0.0095 | 0.1264 | 2.8 | 514. | 642. | 643. | 0.67 | 0.02291 | −25.0 |
| 26 | 0.0066 | 0.1092 | 5.8 | 354. | 480. | 483. | 0.84 | 0.02072 | −23.9 |
| 11 | 0.0166 | 0.0159 | −12.6 | 496. | 692. | 709. | 0.05 | 0.01129 | −14.2 |

ROTARY SPEED = 120. RPM
PENETRATION RATE = 30. FT/HR
ROTATING TIME = 5. HR
IMBALANCE FORCE = 1056. LB
PERCENT IMBALANCED = 7.% of WOB
IMB. FORCE ANGLE = 71. DEG
RAD. IMB. FORCE = 249. LB
CIR. IMB. FORCE = 1156. LB
WEIGHT-ON-BIT = 14576. LB
BIT TORQUE = 2247. FT-LB
TOTAL WEAR FLAT AREA = 0.643 IN

It should be appreciated that the method is not restricted to simply positioning a cutter within a predrilled bore, like cutter 8 is positioned in bore 114. The program can be used to select the position for the bores in the drill bit body of one or more cutters after a preselected number of cutters are installed and the program erances thus saving time and money in the manufacturing process. In addition, the program generates a location for the final cutter or cutters which consistently eliminates or reduce the imbalance force in the drill bit so manufactured. Average quality of bits so manufactured is therefore greatly increased over the average quality of bits manufactured in accordance with prior art methods. Drill bits with relatively small imbalance forces cut faster and last longer than drill bits with greater imbalance forces.

It is to be appreciated that additions and modifications may be made to the instant mode of implementing the method of invention without departing from the spirit thereof which is defined in the following claims.

What is claimed is:

1. A method for making a drill bit of the type having a plurality of cutters mounted on a bit body comprising the steps of:

mounting a preselected number of cutters on the bit body;

generating a model of the geometry of the bit body and cutters mounted thereon;

calculating the imbalance force which would occur in said bit body under defined drilling parameters;

using the imbalance force and model to calculate the position of at least one additional cutter which when mounted on the bit body in said calculated position would reduce said imbalance force; and mounting an additional cutter on said bit body in the position so calculated.

2. The method of claim 1 wherein the step of calculating the imbalance force which would occur in said bit body under defined drilling parameters comprises the step of calculating the imbalance force which would occur in said bit body for a preselected bit rotation rate, penetration rate and rock strength.

3. The method of claim 1 wherein the steps of using the imbalance force and model to calculate the position of an additional cutter and mounting an additional cutter on said bit body comprise:

using the imbalance force and model to calculate the positions of a plurality of additional cutters which when mounted on the bit body in said calculated positions would reduce said imbalance force; and mounting additional cutters on said bit body in the positions so calculated.

4. The method of claim 1 wherein the step of generating a model of the geometry of the bit body and cutters mounted thereon comprises the step of determining the spatial coordinates of a plurality of points on said bit body and on each of the cutters mounted thereon.

5. The method of claim 4 wherein said method further includes the step of calculating the rake angle of the cutting surface of each cutter mounted on said bit body using said spatial coordinates.

6. The method of claim 5 wherein said method further includes the step of generating additional spatial coordinate for each cutting surface by interpolating between the spatial coordinates determined on said cutters.

7. The method of claim 1 wherein each of said cutters includes a cutting surface and wherein the step of calculating the imbalance force which would occur in said bit body for a preselected bit rotation rate, penetration rate and rock strength comprises the steps of:

calculating the relative positions of the cutting surfaces on the cutters;

calculating the forces acting on each cutter for the preselected bit rotation rate, penetration rate and rock strength, and summing the radial forces acting on each cutter to determine the imbalance force.

8. A method for making a drill bit of the type having a plurality of cutters mounted on a bit body comprising the steps of:

mounting a preselected number of cutters, each of which defines a cutting surface, on the bit body;

defining a three-dimensional coordinate system within which said bit body is contained;

determining the coordinates of a plurality of points on said bit body and on each of the cutters mounted thereon;

storing the coordinates so determined in a memory;

calculating the position of each cutting surface relative to the longitudinal axis of the bit body using the stored coordinates;

calculating the forces acting on each of the cutters mounted on said bit body based on the calculation of each cutting surface position for defined drilling parameters;

resolving the radial cutter force components into a single radial imbalance force;

using the imbalance force to calculate the coordinates of an additional cutting surface which if present would reduce the imbalance force; and mounting an additional cutter on the bit body in a position which places the cutting surface thereof at the coordinates so calculated.

9. The method of claim 8 wherein the step of calculating the forces acting on each of the cutters mounted on said bit body based on the calculation of each cutting surface position under defined drilling parameters comprises the step of calculating the forces acting on each of the cutters mounted on said bit body based on the calculation of each cutting surface position for a given rock strength, bit rotation rate and rate of bit penetration.

10. The method of claim 8 wherein the steps of using the imbalance force and model to calculate the position of an additional cutter and mounting an additional cutter on said bit body comprise:

using the imbalance force and model to calculate the positions of a plurality of additional cutters which when mounted on the bit body in said calculated positions would reduce said imbalance force; and mounting additional cutters on said bit body in the positions so calculated.

11. A method for making a drill bit of the type having a plurality of cutters which each comprise a stud adapted to be received in a bore on a drill bit body wherein each stud includes a substantially planar cutting surface formed thereon, said method comprising the steps of:

inserting a predetermined number of such studs into corresponding bores in a drill bit body;

creating an array of spatial coordinates representative of selected surface points on said bit body and on the cutters mounted thereon;

using the array to calculate the position of each cutting surface relative to the longitudinal axis of the bit body;

preselecting values for selected drilling parameters which are representative of the conditions under which the bit will be used;

using the cutting surface positions and preselected values to calculate forces acting on each of the cutters mounted on said bit body;

resolving the radial components of the forces so calculated into a single radial imbalance force;

determining a radial force for each empty bit body bore which has a magnitude and orientation that reduces said imbalance force;

calculating a position for a cutter surface which would produce the force associated with each empty bore; and inserting a cutter stud into each empty bore so that the position of the cutter surface of the inserted cutter stud corresponds to the calculated cutter surface position.

12. The method of claim 11 wherein the step of using the cutting surface positions and preselected values to calculate the forces acting on each of the cutters mounted on said bit body comprises the steps of:

calculating the penetrating forces; and
calculating the cutting forces.

13. The method of claim 11 wherein the step of using the array to calculate the position of each cutting surface relative to the bit body comprises the steps of:

calculating cutting surface back rake; and
calculating cutting surface side rake.

14. The method of claim 13 wherein the step of calculating the cutting surface back and side rakes comprises the steps of:

establishing a vertical reference plane which contains the longitudinal axis of the bit body; and rotating the coordinates defining each cutter surface about the longitudinal axis of the bit body until the center of said cutter surface intersects the reference plane.

15. The method of claim 14 wherein the step of calculating the cutter surface back rake comprises the steps of:

establishing a vertical axis contained within the cutter surface and passing through the center thereof; and measuring the angle between said vertical axis and said reference plane.

16. The method of claim 14 wherein the step of calculating the cutter surface side rake comprises the steps of:

establishing a horizontal axis contained within the cutter surface and passing through the center thereof; and measuring the angle between said horizontal axis and said reference plane.

17. The method of claim 13 wherein said method further includes the steps of:

calculating the effective back rake as a function of side rake, back rake and cutting plane orientation.

18. A method for generating a profile of a drill bit of the type having a plurality of cutters mounted on a drill bit body wherein each cutter includes a substantially planar cutting surface formed thereon, said method comprising the steps of:

creating an array of spatial coordinates representative of selected surface points on said bit body and on the cutters mounted thereon;

using the array to calculate the position of each cutting surface relative to the longitudinal axis of the bit body;

establishing a vertical reference plane which contains the longitudinal axis of said bit body;

rotating the coordinates defining each cutter surface about the longitudinal axis of the bit body; and projecting the coordinates defining each cutter surface onto the reference plane, thereby defining a projected cutting surface profile.

19. The method of claim 18 which further comprises the step of plotting the projected cutting surface profile.

* * * * *